United States Patent
Adamec et al.

(10) Patent No.: US 7,045,781 B2
(45) Date of Patent: May 16, 2006

(54) CHARGED PARTICLE BEAM APPARATUS AND METHOD FOR OPERATING THE SAME

(75) Inventors: Pavel Adamec, Heimstetten (DE); Ralf Degenhardt, Heimstetten (DE); Hans-Peter Feuerbaum, Heimstetten (DE); Harry Munack, Heimstetten (DE); Dieter Winkler, Heimstetten (DE)

(73) Assignee: ICT, Integrated Circuit Testing Gesellschaft fur Halbleiterpruftechnik Mbh, Helmstetten (DE)

( * ) Notice: Subject to any disclaimer, the term of this patent is extended or adjusted under 35 U.S.C. 154(b) by 0 days.

(21) Appl. No.: 10/759,392

(22) Filed: Jan. 16, 2004

(65) Prior Publication Data

US 2004/0169141 A1    Sep. 2, 2004

(30) Foreign Application Priority Data

Jan. 17, 2003    (EP) .................................. 03001048

(51) Int. Cl.
*H01J 37/28* (2006.01)

(52) U.S. Cl. ........................ 250/310; 250/306; 250/307
(58) Field of Classification Search ................ 250/310, 250/306, 307
See application file for complete search history.

(56) References Cited

U.S. PATENT DOCUMENTS

| | | | |
|---|---|---|---|
| 5,430,292 A | 7/1995 | Honjo et al. | 250/310 |
| 5,892,224 A | 4/1999 | Nakasuji | 250/310 |
| 5,973,323 A | 10/1999 | Adler et al. | 250/310 |
| 6,323,499 B1 | 11/2001 | Muraki et al. | |
| 6,586,733 B1 * | 7/2003 | Veneklasen et al. | 250/306 |
| 2002/0153483 A1 | 10/2002 | Parker et al. | |

FOREIGN PATENT DOCUMENTS

| | | |
|---|---|---|
| EP | 0 999 573 A1 | 5/2000 |
| JP | 2002343294 | 11/2002 |
| WO | 99/23684 | 5/1999 |

OTHER PUBLICATIONS

European Search Report, dated Jul. 18, 2003 for EP 02001048.2.
PCT International Search Report for PCT/EP2004/000370, dated Oct. 27, 2004.

* cited by examiner

*Primary Examiner*—Kiet T. Nguyen
(74) *Attorney, Agent, or Firm*—Patterson & Sheridan, L.L.P.

(57) ABSTRACT

A charged particle beam apparatus is provided which comprises a charged particle source for producing a primary beam of charged particles, aperture means for collimating said primary beam of charged particles, wherein said aperture means is adapted to switch between a collimation of said primary beam to a width appropriate for serial imaging of a sample as well as a collimation of said primary beam to a width appropriate for parallel imaging of said sample, a condenser lens for condensing said primary beam of charged particles, scanning means for deflecting said primary beam of charged particles, an objective lens for focusing said condensed primary beam, a sectorized detector for detecting a secondary charged particles. Also, several different operation modes of the beam apparatus are described allowing for serial imaging as well as parallel imaging.

19 Claims, 8 Drawing Sheets

CHARGED PARTICLE BEAM APPARATUS AND METHOD FOR OPERATING THE SAME

CROSS-REFERENCE TO RELATED APPLICATIONS

This application claims benefit of European Patent Application No. 03 001 048.2, filed Jan. 17, 2003, which is herein incorporated by reference.

BACKGROUND OF THE INVENTION

1. Field of the Invention

The present invention relates to a charged particle beam apparatus and a method for operating the same, especially the present invention relates to an electron microscope which may be operated in different modes of operation allowing to switch from a serial imaging mode to a parallel imaging mode and vice versa.

2. Description of the Related Art

A variety of methods have been used to examine microscopic surface structures of semiconductors. These have important applications in the field of semiconductor chip fabrication, where microscopic defects at a surface layer make the difference between a good or bad chip. Holes or vias in an intermediate insulating layer often provide a physical conduit for an electrical connection between two outer conducting layers. If one of these holes or vias becomes clogged, it will be impossible to establish this electrical connection and the whole chip may fail. Examination of microscopic defects on the surface of the semiconductor layers is necessary to ensure quality control of the chips.

Charged particle beams have several advantages over other mechanisms to examine samples. Light beams have an inherent resolution limit of about 100 nm to 200 nm, but electron beams can investigate feature sizes as small as a few nanometers. Electron beams are manipulated fairly easily with electrostatic and electromagnetic elements, and are easier to produce and manipulate than x-rays.

A variety of approaches involving charged particle beams have been utilized for examining surface structure. In scanning electron microscopy (SEM), a narrow beam of primary electrons is raster-scanned across the surface of a sample, also called the working plane. Primary electrons in the scanning beam cause the sample surface to emit secondary or backscattered electrons. Because the primary electrons in the beam of scanning electron microscopy are near a particular known electron energy there is a reduced corresponding charge build-up problem in SEM when compared to other inspection methods, and the surface of the sample remains substantially neutral. However, raster scanning a surface with scanning electron microscopy is slow because each pixel on the surface is collected sequentially. In this context, a pixel may be understood as the diameter of the primary beam on the surface of the sample. However, other definitions may apply more properly for different geometries. Moreover, a complex and expensive electron beam steering system is needed to control the beam pattern.

Another approach called Secondary Electron Emission Microscopy (SEEM) can be much faster than SEM because SEEM does not scan a narrow beam across the sample, but instead directs a relatively wide beam of electrons at the surface. To put this in numerical perspective, the spot size of the scanning beam in Scanning Electron Microscopy (SEM) is typically about 5 nm to 100 nm. The area illuminated by the incident beam in conventional Secondary Electron Emission Microscopy (SEEM) is about 1 mm to 10 mm. Thus, the area illuminated by the beam in conventional SEEM is on the order of $10^9$ to $10^{12}$ times larger than in SEM. Accordingly, SEEM is able to look at a larger surface more rapidly than it is possible in SEM and, in this context, is therefore considered as a parallel imaging method. The primary electron energies in SEEM are close to the point used in SEM, i.e. about 0.5 to 1 keV. Such a SEEM device is described in U.S. Pat. No. 5,973,323 (Adler et al.).

The comparative speed advantage in SEEM, i.e. the maximum pixel rate, is limited mainly by the exposure time and the current density. The minimum exposure time that a beam must spend looking at a given image is determined by the acceptable Signal-to-Noise ratio of the image. The maximum current density is determined by such practical considerations as available gun brightness and possible sample damage, but also by electron-electron interaction. Because the focused beam of primary electrons in SEM must scan the beam across the entire surface to be inspected, the maximum practical pixel rate in Scanning Electron Microscopy is less than or equal to 100 million pixels/second (100 MHz). In Secondary Electron Emission Microscopy (SEEM), a large two-dimensional area of the sample is imaged in parallel without the need for scanning. The maximum pixel rate in SEEM is at least theoretically greater than 800 million pixels/second (800 MHz). The exposure time of the beam in SEEM may correspondingly be much longer than in SEM, and this permits a much lower current density while still maintaining a high Signal-to-Noise ratio. Thus, SEEM has the capability of investigating more sensitive sample surface structures while requiring lower brightness electron beam sources Another approach is called Photo-Electron Emission Microscopy (PEM or PEEM), in which photons are directed at the surface of a sample to be studied, and by the photoelectric effect electrons are emitted from the surface. On an insulating surface, the emission of these electrons, however, may produce a net positive charge on the sample surface since there is a net flux of electrons from the surface. The sample continues to charge positively until there are no emitted electrons, or electrical breakdown occurs. This charge build-up problem may limit the utility of PEEM for imaging insulators. However, depending on the material of the sample, an opposite effect may occur in PEEM, namely that a surface conductance is generated by the incident photons. The mechanism underlying this effect is that of pair production of electrons and holes, so-called excitons, that are generated by the photons, thereby generating enhanced surface conductance of the sample. Thus, electrical charge may be transported away from the region of the incident light beam.

Another method of examining surfaces with electron beams is known as Low Energy Electron Microscopy (LEEM), in which a relatively wide beam of low-energy electrons is directed to be incident upon the surface of the sample, and electrons reflected from the sample are detected. However, LEEM suffers from a similar charge build-up problem since electrons are directed at the sample surface, but not all of the electrons are energetic enough to leave the surface. In LEEM, negatively-charged electrons accumulate on the surface, which repels further electrons from striking the sample, resulting in distortions and shadowing of the surface. In LEEM, it may pose a problem that the surface charges negatively due to the low electron energies.

TAB. 1 below is a chart summarizing the differences between, and advantages of, the four SEM, SEEM, PEEM and LEEM techniques:

TABLE 1

Differences between, and advantages of, the four SEM, SEEM, PEEM and LEEM techniques

|  | Scanning Electron Microscopy (SEM) | Secondary Electron Emission Microscopy (SEEM) | Photo-Electron Emission Microscopy (PEEM) | Low Energy Emission Microscopy (LEEM) |
|---|---|---|---|---|
| Incident Particles | Electrons | Electrons | Photons | Low-Energy Electrons |
| Detected Particles | Secondary Electrons | Secondary Electrons | Photo-Electrons | Reflected Electrons |
| Imaging Method | Raster Scanning | Parallel Imaging | Parallel Imaging | Parallel Imaging |
| Charging | Limited Charging | Limited Charging | Positive Charge Build-Up | Negative Charge Build-Up |

In Scanning Electron Microscopy (SEM), raster scanning imaging must be utilized which leads to a relatively low throughput because the electron beam is focused to a narrow spot size. SEM, however, produces energetic primary electrons incident at an energy of 0.5 to 1 keV, so that a relatively charge-neutral operation is attained. Energetic primary electrons produce secondary electrons in SEM.

In the Secondary Electron Emission Microscopy (SEEM) technique, a beam of energetic primary electrons is directed at the sample surface with an energy of about 0.5 to 1 keV. Because a relatively wide beam of primary electrons is introduced, parallel imaging becomes possible, which is significantly faster than SEM imaging. Moreover, the sample remains charge neutral.

PEEM uses photons instead of primary electrons to produce emitted secondary electrons. PEEM may suffer from the problem of positive charge build-up on insulating sample target materials because secondary electrons are being knocked off the sample surface by the photons, but no negatively charged particles replace these secondary electrons. The inspecting photon beam of PEEM can be wide, and parallel imaging can be achieved.

In Low Energy Electron Microscopy (LEEM), a wide beam of primary electrons is projected at the inspection surface, and parallel imaging can be achieved. These primary electrons are relatively low in energy, and the imaging method involves reflecting these low-energy electrons from the surface. Because only low energy electrons are incident, primary electrons are reflected but few secondary electrons are emitted. Also, the low energy implies a negative charge build-up because some of the electrons may be energetic enough to enter the sample but are not sufficiently energetic to escape the sample surface.

SUMMARY OF THE INVENTION

It is therefore an object of the present invention to provide an improved electron beam apparatus which overcomes at least part of the problems mentioned above. It is also an object of the present invention to provide a method for operating the improved electron beam apparatus.

These objects are at least partly solved by an electron beam apparatus according to claims 1 and 4 and by a method according to claims 13, 14, 15, 18 and 19.

Further advantages, features, aspects and details of the invention are evident from the dependent claims, the description and the accompanying drawings.

According to an embodiment of the present invention, a charged particle beam apparatus is provided which comprises
a charged particle source for producing a primary beam of charged particles,
aperture means for collimating said primary beam of charged particles, wherein said aperture means is adapted to switch between a collimation of said primary beam to a width appropriate for serial imaging of a sample as well as a collimation of said primary beam to a width appropriate for parallel imaging of said sample,
a condenser lens for condensing said primary beam of charged particles,
scanning means for deflecting said primary beam of charged particles,
an objective lens for focusing said condensed primary beam,
a sectorized detector for detecting a secondary charged particles.

This charged particle beam apparatus is capable of two different modes of operation: a first mode (SEM mode) in which the sample is scanned by a highly focused primary beam, and a second mode (SEEM mode) in which the sample is illuminated by a relatively wide primary beam for parallel, multi-pixel imaging. Thus, the apparatus provides the functions of both, a SEM and a SEEM, but within a single device. Accordingly, an apparatus according to the present embodiment requires much less space and only a single vacuum pump means, compared to two single-functional prior art apparatus which are only capable of either SEM or SEEM. Further to this, the cost of purchase of an apparatus according to the present embodiment is much lower compared to the combined costs of a conventional SEM and SEEM. Therefore, the apparatus according to the present embodiment of the invention is good value for users which need the functions of a SEM as well as of a SEEM but not at the same time.

According to a further embodiment of the present invention, a charged particle beam apparatus is provided which comprises
a charged particle source for producing a primary beam of charged particles, a condenser lens for condensing said primary beam of charged particles, aperture means for collimating said primary beam of charged particles, scanning means for deflecting said primary beam of charged particles, an objective lens for focusing said condensed primary beam, wherein said objective lens is adapted to switch between a focus forming an image of said particle source in a plane of a surface of a sample to be serially inspected and a focus forming an image of said aperture means in a plane of a surface of a sample to be parallel inspected, and a sectorized detector for detecting secondary charged particles.

This charged particle beam apparatus is also capable of two different modes of operation: a first mode (SEM mode) in which the sample is scanned by a highly focused primary beam, and a second mode (SEEM mode) in which the sample is illuminated by a relatively wide primary beam for parallel, multi-pixel imaging. Accordingly, the apparatus according to the present embodiment provides similar advantages as the apparatus to the embodiment described above. Especially, homogeneous illumination and high current density are specific advantages of this embodiment. The apparatus of the present embodiment utilizes an adapted objective lens to switch between SEM and SEEM mode wherein switching is accomplished by altering the image plane of the objective lens. In SEM mode the objective lens forms an image of the particle source or an intermediate image of the particle source in the focal plane, thus generating a beam having a very small width in the focal plane. In SEEM mode the objective lens forms an image of the aperture in the focal plane. If the aperture is fully illuminated by the primary beam, a beam having a large width in the focal plane of the objective lens is generated by this mode of operation. However, this is also dependent on the selected magnification which is adjusted by the objective lens.

According to another embodiment of the present invention, the charged particle beam apparatus further comprises a light source for producing a light beam.

The provision of a light source allows additionally for Photo-Electron Emission Microscopy (PEEM) to be accomplished in the present embodiment of the invention. As has been already mentioned above, PEEM may lead to positive charge build-up on insulating surfaces. However, SEEM may lead to negative charge build-up for the aforementioned reasons. Therefore, the apparatus according to the present embodiment may be operated in a combined SEEM/PEEM mode when inspecting insulating surfaces. In this combined SEEM/PEEM mode, the primary beam and the light beam may be adjusted such that the effects of negative/positive charge build-up on insulating surfaces cancel each other and leave the surface in a stable, substantially uncharged state. Thus, also very sensitive structures may be inspected with a largely reduced possibility of damaging them. Moreover, for other materials the incident light beam induces pair production of electrons and holes, thereby generating enhanced surface conductance. The excess charge built up by SEEM inspection could thus be transported away from the illuminated area on the sample surface.

According to an aspect of the present invention, a method for operating a charged particle beam apparatus comprising a particle source, an aperture, an objective lens is provided, wherein said method comprises the steps of producing a charged particle beam, collimating said beam by said aperture, and focusing the beam by said objective lens, wherein an image of said aperture is formed on the surface of a sample to be inspected.

According to an aspect of the present invention, a method for operating the charged particle beam apparatus according to an embodiment of the present invention is provided, wherein the method of operation of the charged particle beam apparatus is switched in operation between at least two of modes SEM, SEEM, PEEM and SEEM/PEEM.

The above method allows to tap the full potential of the present invention in that a user may select different operation modes and apply them to the same sample without the need of transferring the sample to a different device for each respective mode of operation. Thus, a considerable amount of time and money can be saved since, e.g., the whole device has to be evacuated just once.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE PREFERRED EMBODIMENT

It is to be understood within the context of the embodiments of the present invention that a charged particle beam is preferably an electron beam. However, this should not be understood as limiting the scope of the present invention since also other charged particles like, e.g. protons or ions, can be used in an apparatus or method according to the present invention.

Figure 1:
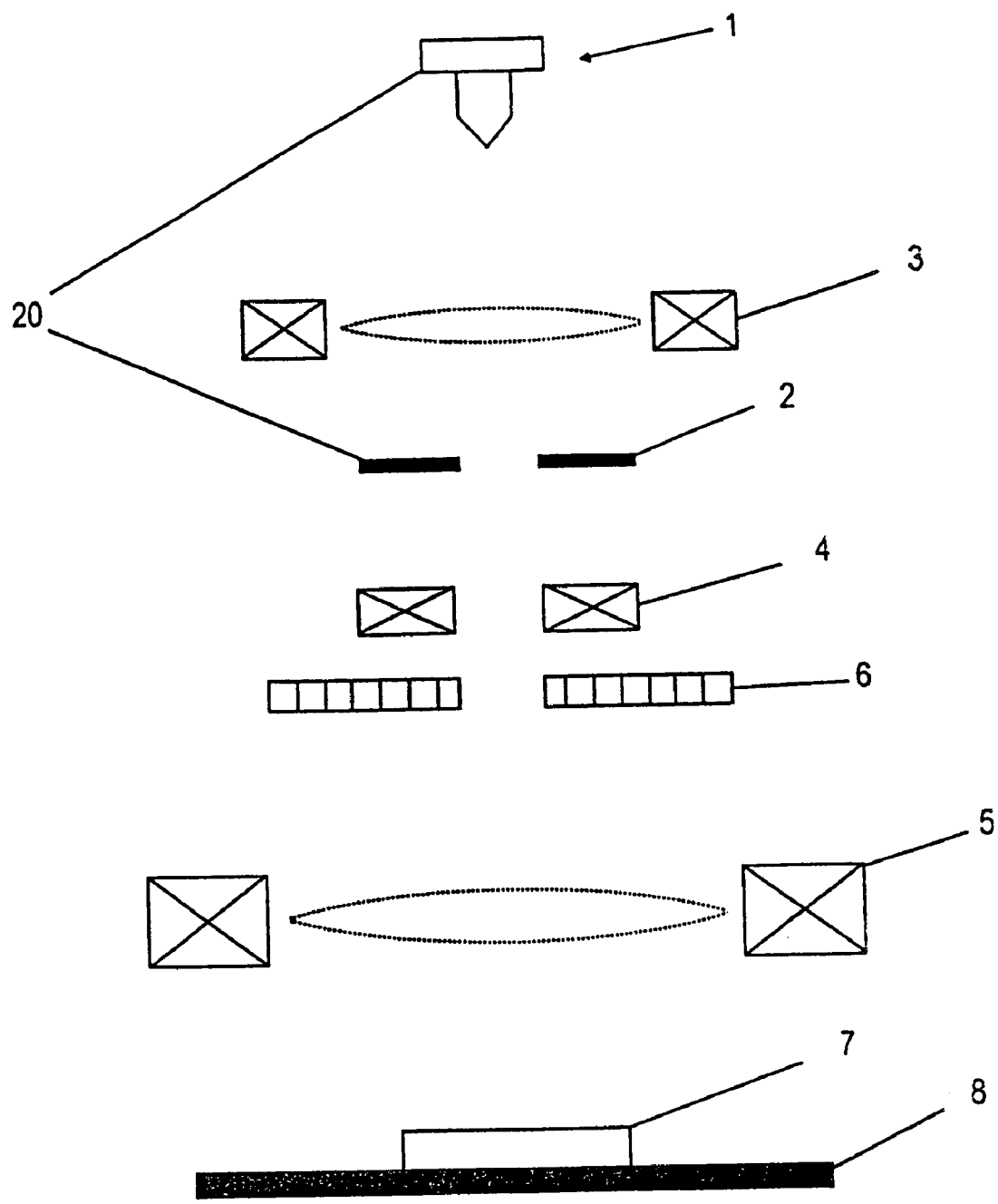
FIG. 1 is a schematic drawing of an apparatus according to a first embodiment of the present invention.

FIG. 1 shows an electron beam apparatus according to a first embodiment of the present invention. This apparatus comprises a electron source 1, which produces a primary beam of electrons during operation. Typical electron sources are filaments, e.g. made of tungsten, but can also be formed by micro emitter tips or arrays of those.

In some embodiments according to the present invention, an aperture means 2 is provided which is adapted to switch between two different modes of collimation, a serial imaging mode (SEM mode) and a parallel imaging mode (SEEM mode). In the specific embodiment shown in FIG. 1, the aperture means 2 is disposed below the electron source 1 to collimate the electron beam to a desired width. Preferably, the primary beam width appropriate for serial imaging has a width on the surface of the sample between 1 nm and 50 nm, and a primary beam width of about 2 nm is especially preferred. These preferred primary beam widths allow for excellent spatial resolution in the SEM mode. However, in the parallel imaging mode, the preferred primary beam width is between 0.5 µm and 1000 µm, preferably between 1 µm and 100 µm, and it is especially preferred if the primary beam width is about 10 µm. When comparing the especially preferred embodiments, the primary beam width is adjusted to about 2 nm in the SEM mode and to about 10 µm in the SEEM mode, i.e. the beam width is $5 \cdot 10^3$ times larger in the SEEM mode than in the SEM mode. Thus, the apparatus can operate much faster in the SEEM mode than in the SEM mode because SEEM images thousands or even millions of pixels in parallel depending on the resolution of the detector.

Generally, the different primary beam widths in SEM and SEEM mode are provided in that the aperture means 2 is formed as an aperture having a diameter in the range of 10 µm to 50 µm in the SEM mode of operation, and the aperture means is an aperture having a diameter in the range of 100 µm to 200 µm in the SEEM mode of operation. However, a different implementation of such an aperture means 2 is provided by an aperture means which comprises the condenser lens 3. In this case, the condenser lens 3 is adapted to switch the beam width of said primary beam between a width appropriate for serial imaging and a width appropriate for parallel imaging, This switching is accomplished by altering the focal length of the condenser lens 3. Therefore, it is not necessary to change apertures in the case where the collimation of the primary beam is achieved by appropriate operation of the condenser lens.

One possible embodiment of an adjustable aperture is to provide at least two different apertures, one having a diameter in the range of 10 μm to 50 μm and one having a diameter in the range of 100 μm to 200 μm. For example, the apertures could be formed as small platinum disks or molybdenum strips with holes. These at least two apertures are disposed on a lens aperture holder and can be centered by an aperture assembly which permits both X- and Y-centering of each aperture disk in the column.

Another embodiment of the adjustable aperture means 2 is now described with reference to FIGS. 2 and 3. FIG. 3 shows the beam shaping section 20 of the beam apparatus in the case where a so-called multi aperture is provided. Several examples of such multi apertures and their respective modes of operation are described in EP 0 999 573 A1. For ease of understanding, the condenser lens 3 is not shown in FIG. 3.

Figure 2:
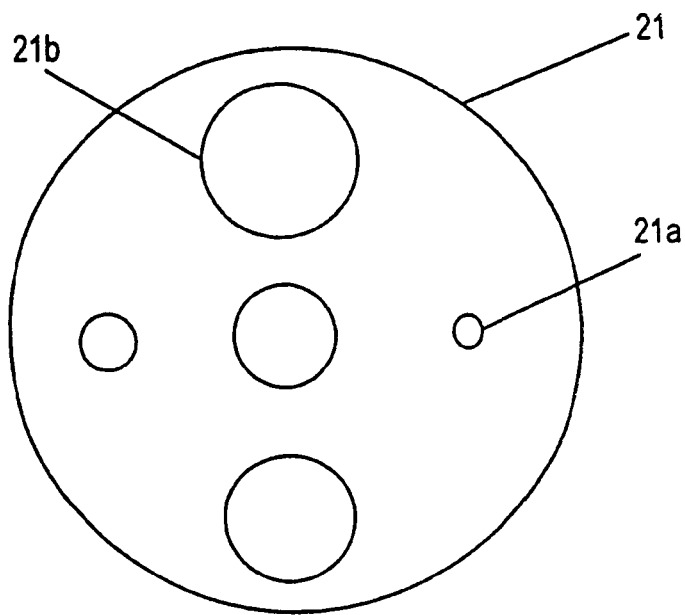
FIG. 2 is a top view of a multi aperture unit with several beam defining apertures arranged in a circle around the center beam defining aperture located in the middle of the circular plate.
Figure 3:
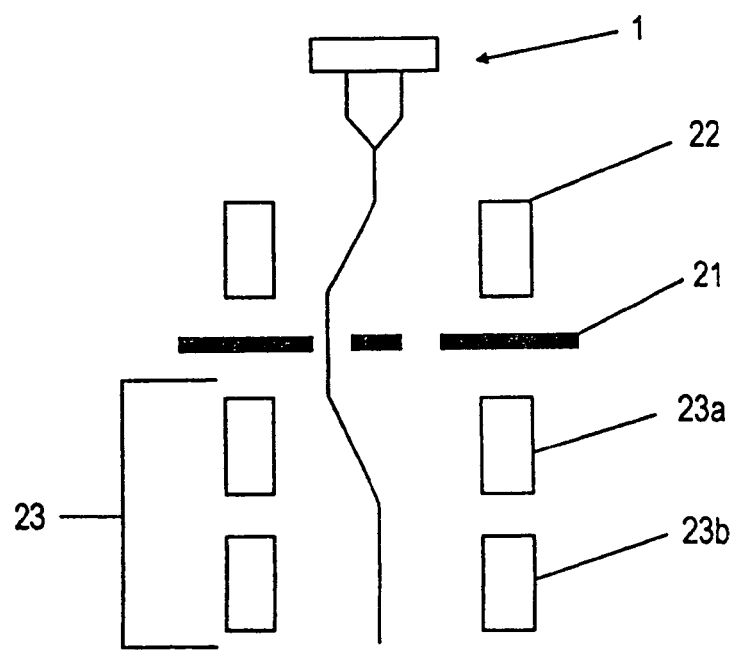
FIG. 3 is a schematic drawing of the beam shaping section of the beam apparatus shown in FIG. 1 in the case where a multi aperture and first and second deflection units are provided.

An embodiment of such a multi aperture is shown in FIG. 2, where multi aperture 21 is a circular flat disc having several beam defining openings 21a, 21b with a specified diameter. According to the present invention, the openings 21a, 21b are divided into two different groups, namely one group 21a having a width appropriate for serial imaging and a second group 21b having a width appropriate for parallel imaging. Preferably, the diameters of the openings 21a belonging to the first group are in the range of 10 μm to 50 μm, and the diameters of the openings 21b belonging to the second group are in the range of 100 μm to 200 μm. Before the beam passes through one of these openings, it generally has a diameter bigger than the diameter of the opening. Thus, the beam defining aperture only allows electrons to pass whose distance from the beam axis is smaller than the aperture diameter and eliminates the rest. The first deflection unit is capable of directing the beam through any one of the beam defining apertures 21a, 21b in multi aperture unit 21 thereby determining the beam diameter and, consequently, the current of the beam. The selection of a specific beam defining aperture is the choice of the user and based on his intentions, namely the selection depends on whether the user intends to conduct a SEM or a SEEM mode inspection of the sample. In view of the present invention, it is not required to arrange beam defining apertures 21a, 21b in a specific pattern on multi aperture unit 21. It is, however, preferred to have sufficient distance between outer rims of adjacent apertures so that electrons flying on the outmost trajectories of the beam do not incidentally pass through neighboring apertures. On the other hand, the distances between outer rims of adjacent apertures should not be too wide. This permits deflections of the beam with smaller angles since the center of beam defining apertures 21a, 21b are arranged closer to the center of multi aperture unit 21. Furthermore, it is preferred to have one beam defining aperture located in the center of multi aperture unit 21. If a certain application requires the use of the center aperture, then it is not necessary to deflect the e-beam which can remain on the optical axis.

The operation of a multi aperture is now described with respect to FIG. 3. Electron beam source 1 emits a beam of electrons towards multi aperture 21. Multi aperture 21 comprises several openings 21a, 21b of different size. A first deflecting unit 22 directs the beam of electrons through one of the beam defining apertures 21a, 21b and a second deflecting unit 23 directs the beam of electrons back to the optical axis. Second deflection unit 23 comprises two deflection stages 23a and 23b. The beam, after having been delimited by one of the beam defining apertures 21a, 21b, diverges from the optical axis. In a first step, deflection unit 23a redirects the beam and guides it back towards the optical axis. At the point of intersection or, in case the beam does not intersect with the optical axis, at a point where the e-beam passes the optical axis in close vicinity, deflection unit 23b redirects the beam so that it propagates along the optical axis or in close vicinity to the optical axis and more or less parallel to it. The expression "more or less parallel" within the meaning of this invention includes deviations in which the beam still passes the objective lens close to its center without causing excessive imaging artifacts.

The provision of a double stage second deflection unit 23a and 23b disposes, in certain applications, the provision of a third deflection stage, since the beam already propagates in a direction close to the optical axis. Nevertheless, even in a beam column with a double stage second deflection unit 23a and 23b, it is in some applications preferred to have an additional double stage third deflection unit. The provision of such allows conducting a parallel shift of the e-beam.

Turning now back to FIG. 1, a condenser lens 3 is disposed above the aperture means 2. The effect of the field produced by the condenser lens 3 is equivalent to an optical lens and symbolized by the lens-shaped dotted lines. Scanning means 4 are disposed below aperture means 3 for deflecting the primary beam when scanning the sample 7. An objective lens 5 is disposed below scanning means 4 for focusing the primary beam. Similar to condenser lens 3, the lens-shaped dotted lines denote the effect of the field produced by objective lens 5. Typically, objective lens 5 comprises an electrostatic portion as well as a magnetic field portion.

Finally, a sectorized detector 6 may be provided in all embodiments according to the present invention. In the specific embodiment shown in FIG. 1, the detector 6 is ring-shaped and concentrically aligned with the optical axis of the beam column. Detector 6 is disposed between objective lens 5 and scanning means 4 for detecting secondary electrons emitted from sample 7. However, this arrangement is a mere example and the detector 6 may have other shapes than ring-like, e.g. full circle or square shapes. Furthermore, detector 6 may also be disposed at other positions, e.g. below objective lens 5, or may even be not centered around the optical axis but disposed at a lateral position at the side of the beam column. Preferably, sectorized detector 6 is a multichannel plate with sectorized anode. However, also other types of sectorized detectors can be used in the apparatus according to the present invention. Especially, an array of semiconductor diodes is preferred for the sectorized detector. Reverse biased p-i-n diodes having a large i-region may be used as semiconductor detectors. Secondary electrons incident on a p-i-n diode generate electron-hole pairs in said i-region which are detected by an analyzing circuitry.

Figure 4:
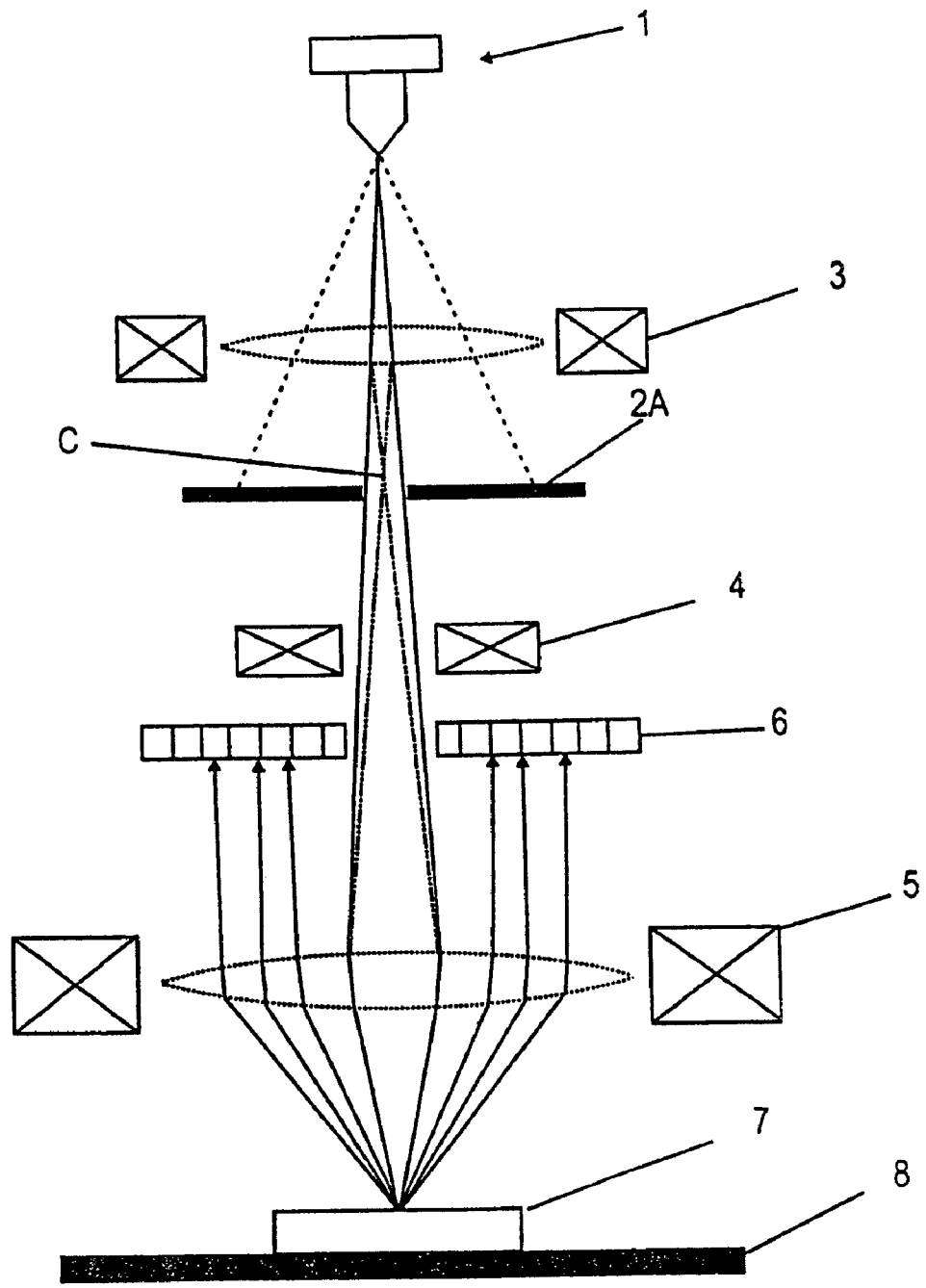
FIG. 4 shows the embodiment of FIG. 1 in a first mode of operation.

Two different modes of operation of the embodiment shown in FIG. 1 are now described with reference to FIGS. 4 and 5. FIG. 4 shows a first mode of operation, referred to as SEM mode, where the aperture means 2 is adjusted for collimating the primary beam to a width appropriate for serial imaging of a sample. Particle source 1 emits electrons within a relatively wide angle which is indicated by the dotted lines extending from source 1. This relatively wide beam is collimated by the aperture means 2. Preferably, the adjustment of the aperture means 2 is done by applying art aperture 2A having a diameter in the range of 10 µm to 50 µm. Thus, the primary beam is blocked outside the opening of the aperture and only a collimated beam is allowed to pass the aperture.

The full lines in FIG. 4 show the beam path of the primary beam when the condenser lens 3 is not in operation. The width of the primary beam is then only geometrically determined by the diameter of the aperture 2A. Furthermore, the demagnification is solely determined by the spacing between source and objective lens and the spacing between objective lens and sample. A different possible beam path is shown by the dash-dotted lines in FIG. 1. This beam path is achieved by operating condenser lens 3 as to collimate the primary beam and generate a crossover C. It may be advantageous to use the latter mode of operation since it gives more flexibility in demagnification which may be varied over magnitudes by appropriate adaptation of the condenser lens.

Objective lens 5 is adjusted to focus the primary beam on sample 7, i.e. to minimize the spot size of the primary beam on the sample. Typically, the primary beam width in the SEM mode is between 1 nm and 100 nm, preferably between 1 nm and 50 nm, and is especially preferably about 2 nm. The sample 7 is then raster scanned using the scanning means 4, wherein the primary beam is directed to a respective position of a single pixel on the sample 7. The arrows indicate secondary or backscattered electrons emitted from the surface of the sample 7 and which are detected by the sectorized detector 6. Since in the SEM mode only a single pixel is imaged at a time, the plurality of signals produced by the individual sectors of the detector 6 is merged to form a signal corresponding to the single pixel presently imaged. Thus, in SEM mode a serial imaging of the sample is conducted. The signal corresponding to the single pixel may be a single signal, i.e. all the signals of all individual sectors are merged into one signal, or may be a signal consisting of a few number of subsignals which are produced by merging the signals of individual sectors belonging to specific subsets. As an example, there may be provided five subsets corresponding to the center and four quadrants. The advantage of providing such a spatially resolved signal for a single pixel is that topology information can be extracted from the signal. Nevertheless, it should be noted that even in the case of a spatially resolved signal, only one pixel at a time is imaged in the SEM mode.

Summarizing the above, this allows to operate an apparatus according to an embodiment of the present invention in a SEM mode, i.e. the apparatus operated according to the above method serves as a Scanning Electron Microscope. As mentioned above, this mode of operation allows for excellent spatial resolution in sample imaging, but only relatively low throughput is achieved due to serial pixel processing: The narrow spot size of the primary electron beam, typically about 2 nm diameter, defines the pixel region on the surface of the sample. Secondary electrons emitted from that region are detected by the sectorized detector wherein each sector has a corresponding signal channel. In the SEM mode, the signals of the individual sectors are merged into a single or few output signals which represent the pixel momentarily imaged. Thus, the total detector surface is used for imaging a single pixel.

Figure 5:
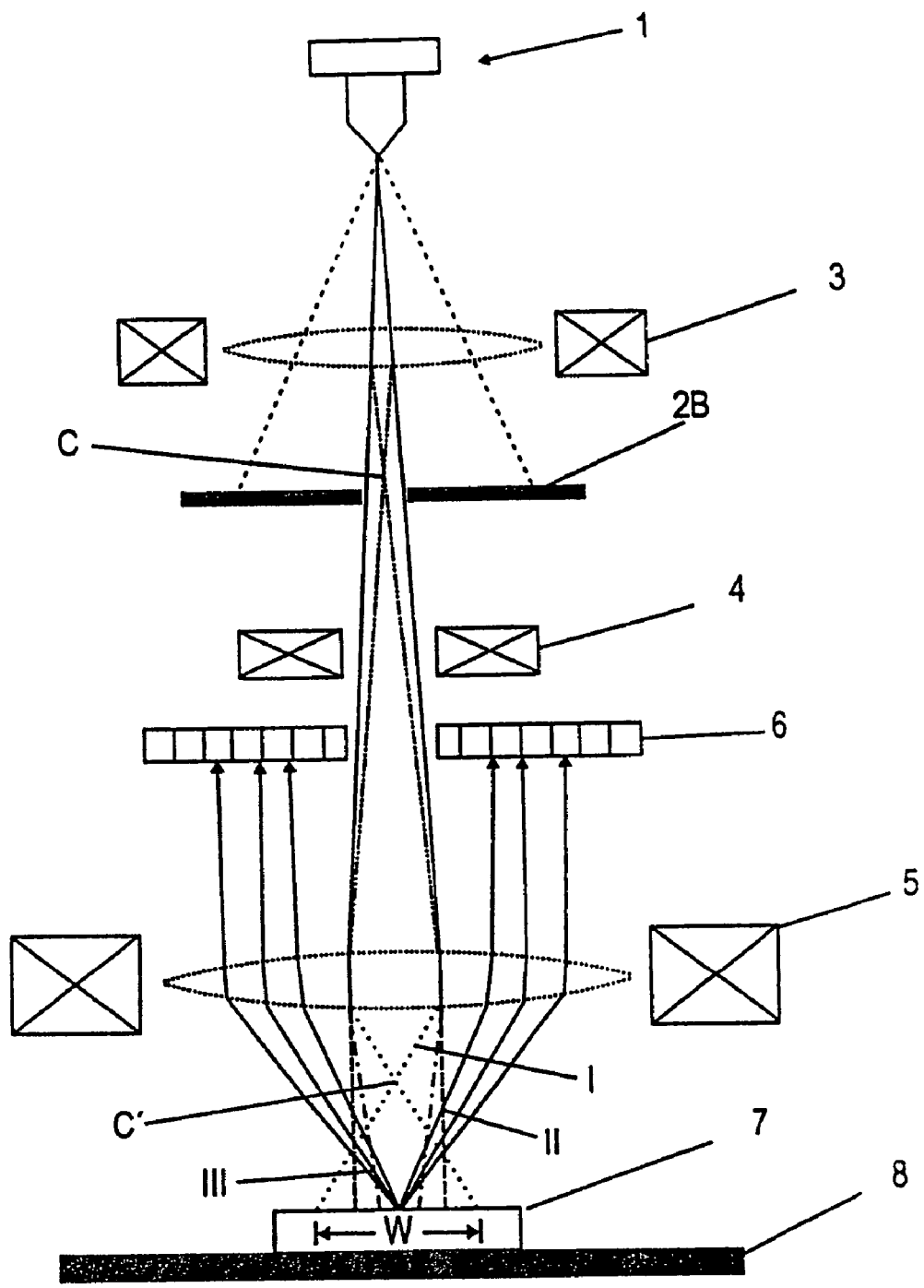
FIG. 5 shows the embodiment of FIG. 1 in a second mode of operation wherein also optional operation modes of the objective lens are shown.

FIG. 5 shows a different mode of operation, referred to as SEEM mode, wherein the aperture means 2 is adjusted for collimating the primary beam to a width appropriate for parallel imaging of a sample. Preferably, the adjustment of the aperture means 2 is done by applying an aperture 23 having a diameter in the range of 100 µm to 200 µm, which could be preferably done by selecting an aperture 21b having a large width of a multi aperture. This allows for a primary electron beam which is wide enough for illuminating a relatively large portion of the sample surface. Furthermore, when using a large aperture for the aperture means, a sufficient parallelity of the beam may be achieved.

Also in SEEM mode, condenser lens 3 may be in operation or not. As in FIG. 4, the full line shows the beam path without operation of condenser lens 3 and the dash-dotted line shows the beam path with the aforementioned operation of condenser lens 3. Objective lens 5 is operated in a different way compared to SEM mode. Three typical modes of operation of objective lens 5 are indicated by roman numbers in FIG. 5. According to a first mode of operation of objective lens 5 which is indicated by dotted line I, the objective lens is operated in such a way that an image of the aperture 2 is produced in the sample plane. Below crossover C' the beam widens again and illuminates an area of width W on the sample surface. The width W of this area depends on the focusing properties of objective lens 5 and the spacing between objective lens 5 and sample 7. The beam path in a second mode of operation is indicated by dashed line II, where objective lens 5 is operated to focus the primary beam in an plane at infinite distance. Thus, the primary beam incident on the sample is parallel and its width depends on the width of the primary beam at the entrance of objective lens 5. The beam path of the primary beam in a third mode of operation of objective lens 5 is indicated by dash-dotted lines III. In this third mode, objective lens 5 is adjusted to focus the primary beam on a plane behind sample 7 but at finite distance, such that the size W of the area on the sample illuminated by the primary beam becomes large.

It should be understood that the focusing of the primary and secondary electrons is not independent from each other, but it is possible to achieve the same focusing in every one of the three aforementioned modes of operation. However, it may be necessary to adjust the relative positions of the particle source, the objective lens and the detector to this end. Alternatively, an intermediate acceleration voltage or additional lenses, e.g. a second condenser lens, may be utilized to adjust the focusing of the primary and secondary electrons independently.

Since the objective lens influences the behavior of both primary and secondary electrons, it is not desirable to alter the parameters of the objective lens during operation when switching between operation modes. Nevertheless, other elements of the apparatus can be operated substantially independently to achieve the required operation mode. Especially, it is possible to control the spot size of the primary beam by adjusting the condenser lens 3. When the focal length of the crossover produced between the condenser lens 3 and the objective lens 5 is reduced, the spot on the sample 7 surface is narrowed. Vice versa, if the focal length of the crossover produced between the condenser lens 3 and the objective lens 5 is increased, the spot on the sample surface is widened. Therefore, the focal length of the crossover produced between the condenser lens 3 and the objective lens 5 is increased in the SEEM mode and is reduced in the SEM mode.

Typically, the primary beam width in the SEEM mode is between 0.5 µm and 1000 µm, preferably between 1 µm and 100 µm, and is especially preferably about 10 µm. Thus, the area illuminated in the SEEM mode is preferably about $2.5 \cdot 10^7$ times larger than the area illuminated in SEM mode.

Figure 6:
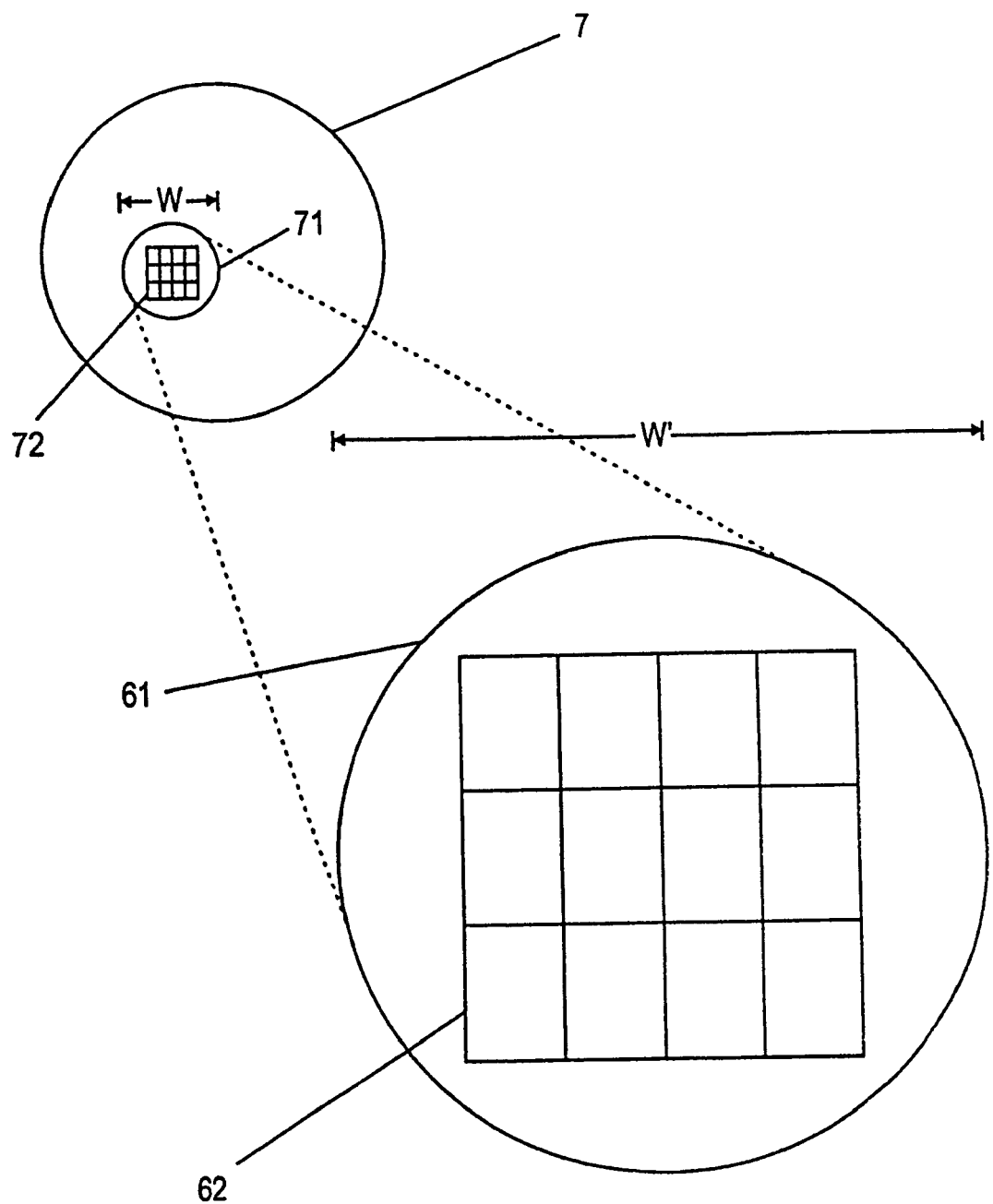
FIG. 6 shows in a schematic way the principle of spatial resolution with a sectorized detector.

Preferably, not the whole area illuminated is imaged as will be described now with reference to FIG. 6. Primary beam 71 is produced by the beam apparatus and has a width W at the surface of the sample 7. FIG. 6 further shows a magnified view of the imaging portion of beam 71 on sample 7 as it is imaged by a sectorized detector. As can be seen, the relatively small area 71 at the surface of the sample is imaged on a much larger detector area 61 of width W'. For facilitation of understanding, detector area 61 is not depicted as a ring-shaped area but as a simple full circle so that no difficulties due to different topologies of imaging area 71 and detector area 61 have to be taken into account. Since the detector is sectorized, each sector 62 represents a much smaller area 72 on the sample surface. Furthermore, typically not the whole area 71 but only its central portion is imaged as is indicated in FIG. 6. Thereby, edge effects can be eliminated as, e.g., image distortions due to non-uniformities in charge on the imaging surface: Typically, the sample surface areas at the edge of the beam 71 have less uniform charge distributions than surfaces at the interior portion of the beam because there is no electron flux outside the circumference of the beam diameter.

As an example for the principle of spatial resolution with a sectorized detector, the sample 7 is imaged with a magnification of 2000. Then, if the area W on the sample surface is 10 µm, the width W at the detector area is 20 mm. If the detector is, e.g., sectorized in 100×100 elements 62 of a dimension of 200 µm, each element represents a corresponding area 72 of 100 nm dimension on the sample surface.

Going back to FIG. 5, secondary electrons emitted from the surface of the sample 7 are indicated by arrows. The secondary particles are detected by the sectorized detector 6 and each of the plurality of signals produced by the individual sectors 62 of the detector 6 represents a respective portion 72 of the sample surface. Thus, the spatial resolution in SEEM mode is determined by the magnification as well as the number and size of the sectors 62 of the detector 6. Since the number of sectors 62 of the detector is high, e.g. 10,000 or higher, and all sectors 62 of the detector produce their own, individual signal, at least the center part of the illuminated sample surface area 71 is imaged in parallel. Thus, SEEM could also be called a multi-pixel imaging mode.

When operating in SEEM mode, the scanning means 4 are not necessarily used: In the SEEM mode, the width of the primary beam is much larger than in the SEM mode, but it may still be necessary to move the sample 7 with respect to the beam to scan the sample. However, only mechanical movement of the stage 8 of the sample 7 with respect to the primary beam and not a scanning means 4 for electromagnetically steering the primary beam may be used in SEEM mode. Furthermore, it may be desirable for a specific application to provide a highly parallel beam which may be achieved by deflecting the beam as little as possible. Therefore, a movable stage 8 provides a good means for mechanically moving the sample relative to the primary beam. On the other hand, the scanning means 4 may also be used in SEEM mode. Especially, their operation is much faster than the mechanical operation of the movable stage. Also, the scanning means and the movable stage may be operated in combination.

Summarizing the above, the above described operational measures allow to operate an apparatus according to an embodiment of the present invention in a SEEM mode, i.e.

the apparatus operated according to the above serves as a Secondary Electron Emission Microscope. In this mode, the sectorized detector is operated such that the signals stemming from individual sectors are separately processed in parallel. Thus, this mode of operation allows for high throughput due to parallel, multi-pixel imaging, but spatial resolution is not as high as in the SEM mode: In SEEM mode, spatial resolution is not defined by the narrow spot size of the primary beam as in the SEM mode, but by the sectorization of the detector, i.e. the pixel size in the SEEM mode is dependent not only on the spot size of the primary beam, but also on the magnification and on the number of sectors of the detector. In the above example, each of the $10^4$ individual sectors of the detector imaged a surface region of the sample with a diameter of 100 nm. When comparing the forestanding with the description of the SEM mode above, the surface region of the sample corresponding to a pixel is typically larger in the SEEM mode than the pixel region in the SEM mode. However, the massive parallel imaging of these larger pixel regions in the SEEM mode leads to a much higher throughput as in the serial SEM mode. Furthermore, sufficient spatial resolution for the objects of SEEM is still achieved by use of a sectorized detector.

Figure 7:
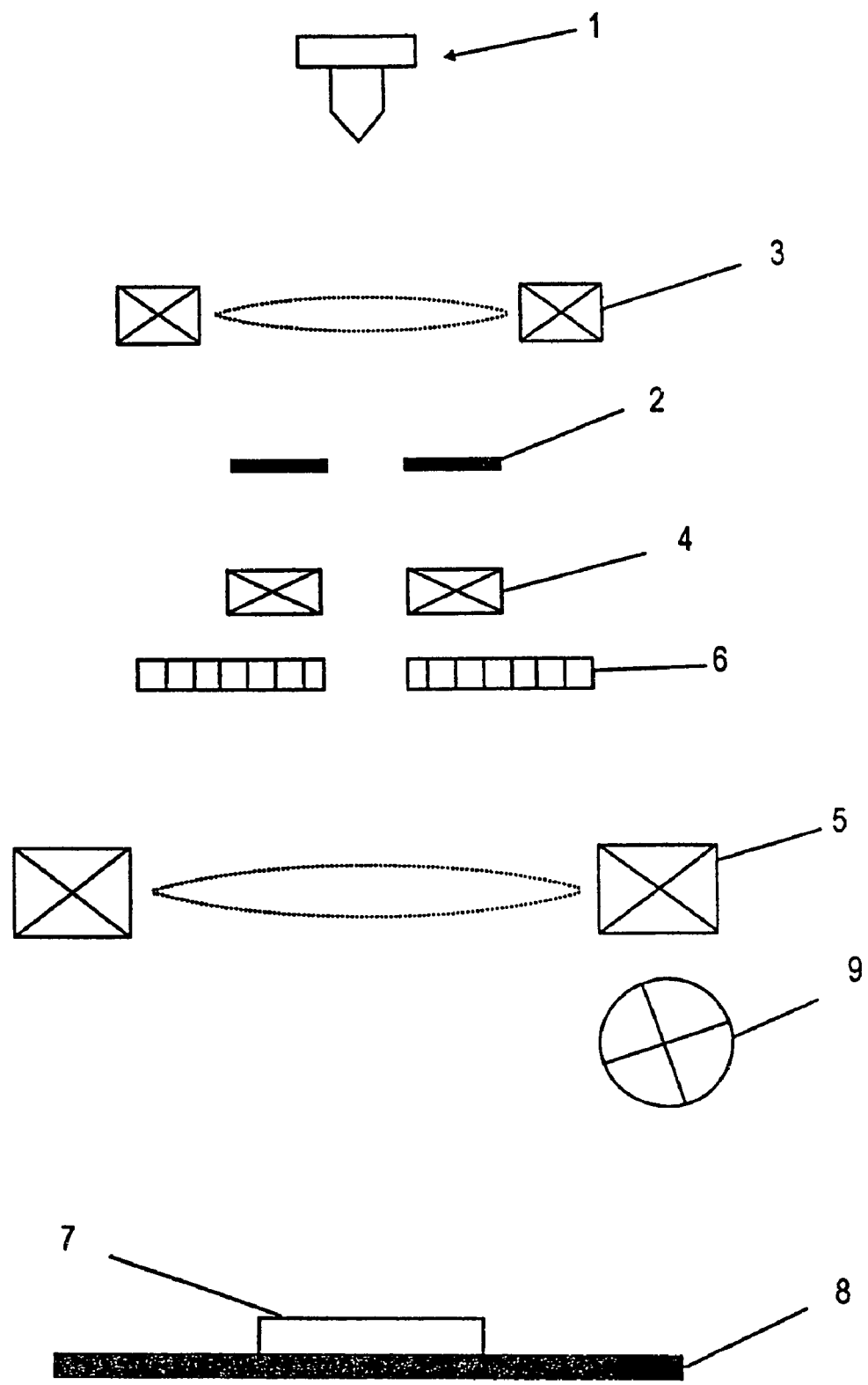
FIG. 7 is a schematic drawing of an apparatus according to a further embodiment of the present invention.

FIG. 7 is a schematic view of a further embodiment of the present invention. The apparatus according to this embodiment comprises substantially the same elements as the first embodiment, namely a electron source 1, aperture means 2, a condenser lens 3, scanning means 4, an objective lens 5, a sectorized detector 6, and a stage 8 on which a sample 7 is placed. Preferably, the aperture means 2 is an aperture 2B having a diameter in the range of 100 µm to 200 µm. This allows for a primary electron beam which is wide enough for illuminating a relatively large portion of the sample surface. Furthermore, when using a large aperture 2B for the aperture means 2, a sufficient parallelity of the beam may be achieved. As a main difference to the embodiment shown in FIG. 1, an additional light source 9 is provided in this embodiment of the invention.

The provision of a light source allows additionally for Photo-Electron Emission Microscopy (PEEM) to be accomplished in the present embodiment of the invention. As has been already mentioned above, PEEM may lead to positive charge build-up on insulating surfaces. However, SEEM may lead to negative charge build-up for the aforementioned reasons. Therefore, the apparatus according to the present embodiment may be operated in a combined SEEM/PEEM mode when inspecting insulating surfaces. In this combined SEEM/PEEM mode, the effects of negative/positive charge build-up on insulating surfaces cancel each other and leave the surface in a stable, substantially uncharged state. Thus, also very sensitive structures may be inspected with a largely reduced possibility of damaging them. Also, other classes of materials show enhanced surface conductance induced by the light. The underlying mechanism of pair production of electrons and holes also allows for reduction of accumulated excess charge.

However, the arrangement of the light source 9 shown in FIG. 7 should not be considered typical or limiting. Especially, the light source 9 could, e.g., also be disposed above condenser lens 5. In this case photons emitted by light source 9 would travel through the electromagnetic field produced by condenser lens 5. However, this lens field would not affect the uncharged photons but only the electrons emitted by source 1. Preferably, light source 9 is a mercury vapor lamp emitting light in the spectral range of 200 nm to 600 nm wavelength. Light of a wavelength between 200 nm and 600 nm is relatively simple to produce by the mercury vapor lamp. Furthermore, the light source 9 preferably comprises a parabolic mirror which directs the light of the lamp onto the sample 7. Light of a wavelength between 200 nm and 600 nm is very difficult to focus by means of conventional lens optics. A parabolic mirror allows for substantially parallel light beams also in this range of wavelength. For some applications, parallelity of the light beam is important for a homogeneous exposure and allows therefore for images with better properties. If a parabolic mirror is considered too expensive, the parabola may be approximated by intersecting mirror planes.

It is further preferred that the sample 7 is supported and moved by a movable stage. Although the width of both the primary beam and the light beam is relatively large, it may still be necessary to move the sample with respect to the beam to scan the sample. However, SEEM/PEEM may require mechanical movement of the stage of the sample with respect to the primary beam, since it may not be desirable to have additional deflecting means for the light beam, especially when taking into account that light at the typically used wavelengths of 200 nm to 300 nm is difficult to deflect by conventional optics. Furthermore, it may be desirable for some applications to provide highly parallel beams which may be achieved by deflecting the beams as little as possible. In these cases, a movable stage provides a good means for mechanically moving the sample relative to the primary beam and the light beam. However, as has been described above, also the scanning means may be used for deflecting the primary beam so that one may take advantage of their superior speed compared to the mechanical movement of the movable stage.

Preferably, all apparatuses in accordance with the present invention may further comprise blanking means for blanking the primary beam of electrons.

The blanking means can blank the primary beam in case it is desired to have no electron beam incident on the sample. Otherwise, i.e. without the blanking means, the source of electrons would have to be turned off is this case. Due to the blanking means, it is not necessary to turn off the electron source if a pure PEEM mode operation of the apparatus is desired. Accordingly, the lifetime of the source is not negatively influenced by subsequently switching it on and off. Furthermore, it is possible to switch between SEEM or SEEM/PEEM modes and a pure PEEM mode very quickly since the primary beam has only to be blanked or unblanked by the blanking means.

Preferably, the blanking means are formed by a pair of electrodes which deflect the primary beam away from the axis of the column. Furthermore, an aperture is disposed in the path of the deflected beam so that the beam is not incident on the sample surface. It is especially preferred to use the aperture for collimating the primary beam also as an aperture for the blanking means. Another possibility of forming the blanking means can be provided if the particle source is formed by field emission cathodes, i.e. an array of emitter tips. In this case, the blanking may be effected by reducing the extraction voltage applied between the emitter tip and the gate electrode. Since the beam current of an emitter tip depends almost exponentially on the extraction voltage, a reduced extraction voltage leads to a considerably reduced beam current which, in result, has the same effect as blanking the beam by the aforementioned electrodes.

Figure 8:
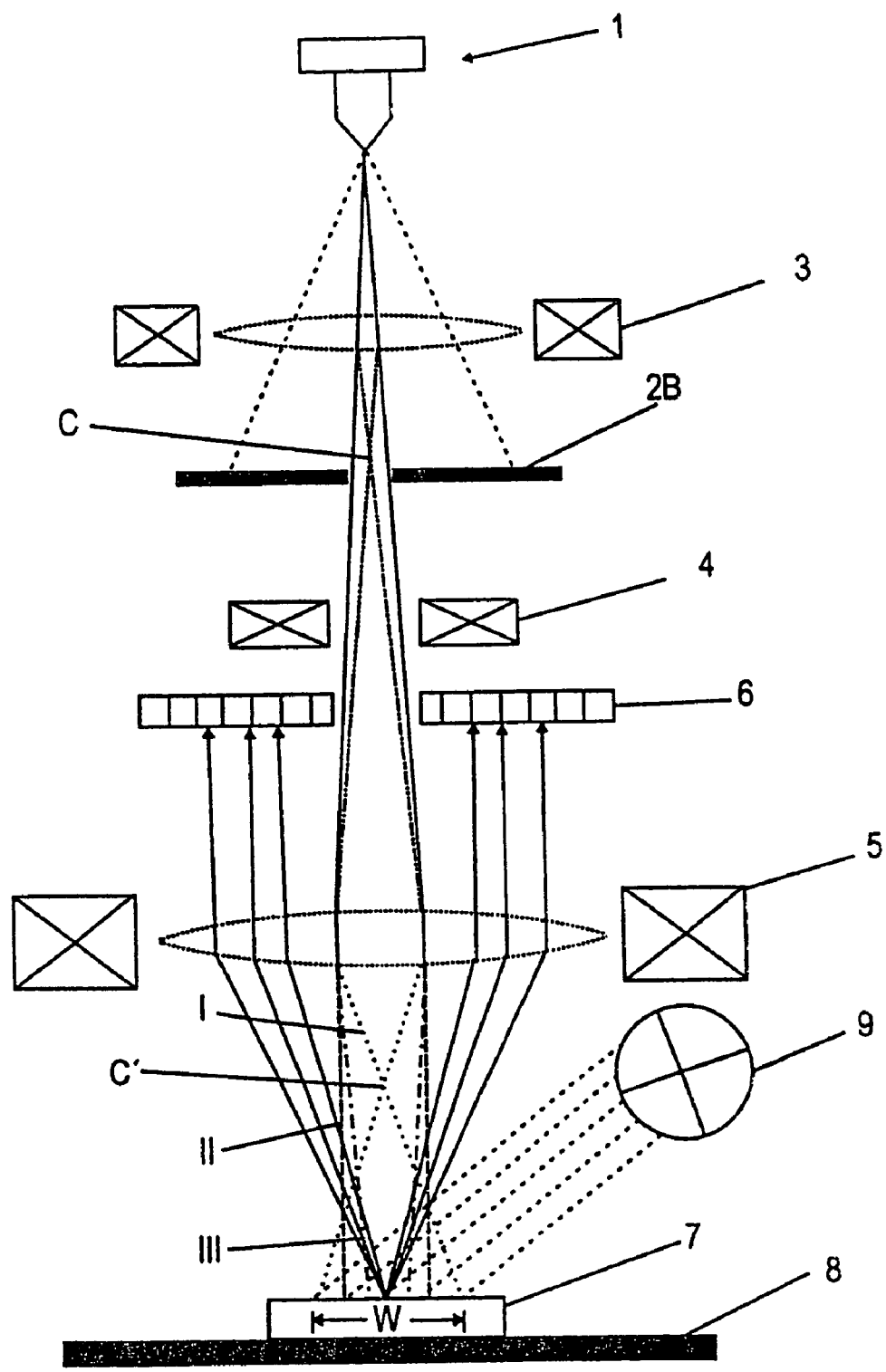
FIG. 8 shows the embodiment of FIG. 7 in a first mode of operation.

FIG. 8 shows one of the embodiments of the invention described in connection with FIG. 7 in a first mode of operation, referred to as combined SEEM/PEEM mode hereinafter. In this combined SEEM/PEEM mode, the electron beam apparatus is operated in the SEEM mode described above, i.e. a large aperture 2B is chosen and the condenser lens 3 is adjusted as to widen the primary beam. Additionally, in the combined SEEM/PEEM mode, the light source 9 is operated as to emit light of a short wavelength onto sample 7. Preferably, the area illuminated by the primary beam and the light beam at the sample surface are substantially the same. It is further preferred that the spots of the primary beam and the light beam at the sample surface coincide substantially.

All of these operational measures allow to operate an apparatus according to an embodiment of the present invention in a combined SEEM/PEEM mode, i.e. the apparatus operated according to the above method serves as a Secondary Electron Emission Microscope as well as a Photo-Electron Emission Microscope. In this mode, the sectorized detector is operated such that the signals stemming from individual sectors are separately processed in parallel. Both the SEEM and PEEM modes reveal different information about the sample which may be collected simultaneously in this combined SEEM/PEEM mode.

Preferably, the electron beam and the light beam are adjusted to cancel each others respective charge build-up in the combined SEEM/PEEM mode. As has been already mentioned above, SEEM may lead to a negative charge build-up of the sample surface in case fewer secondary electrons are emitted than primary electrons are collected by the sample 7. Also, it has been described that PEEM may lead to a positive charge build-up on insulating surfaces since the electrons emitted due to the photo-effect are not replaced. Therefore, the negative and positive charge build-ups of SEEM and PEEM can be counterbalanced by applying both modes of operation simultaneously and adjusting the intensity of the light beam and the beam current of the primary beam such that the electrons deposited by the primary beam substantially equal the number of electrons removed by the photo-effect. Thus, a substantially electrically neutral and stable state of the sample surface can be achieved and damage to the sample due to charge build-up can be avoided.

As has been discussed above, the reduction of unwanted charge build-up can be prevented by the combined SEEM/PEEM mode also for another class of materials where the above mechanism does not work. For these materials excitons are produced by the incident light of the light source. Accordingly, the surface conductance may increase since the electrons or holes, although in a quasi-bound state, contribute to enhanced charge transport in the sample. Thus, charge build-up caused by SEEM inspection can be transported away from the illuminated area. Also by this mechanism a substantially electrically neutral and stable state of the sample surface can be achieved and damage to the sample due to charge build-up can be avoided.

Figure 9:
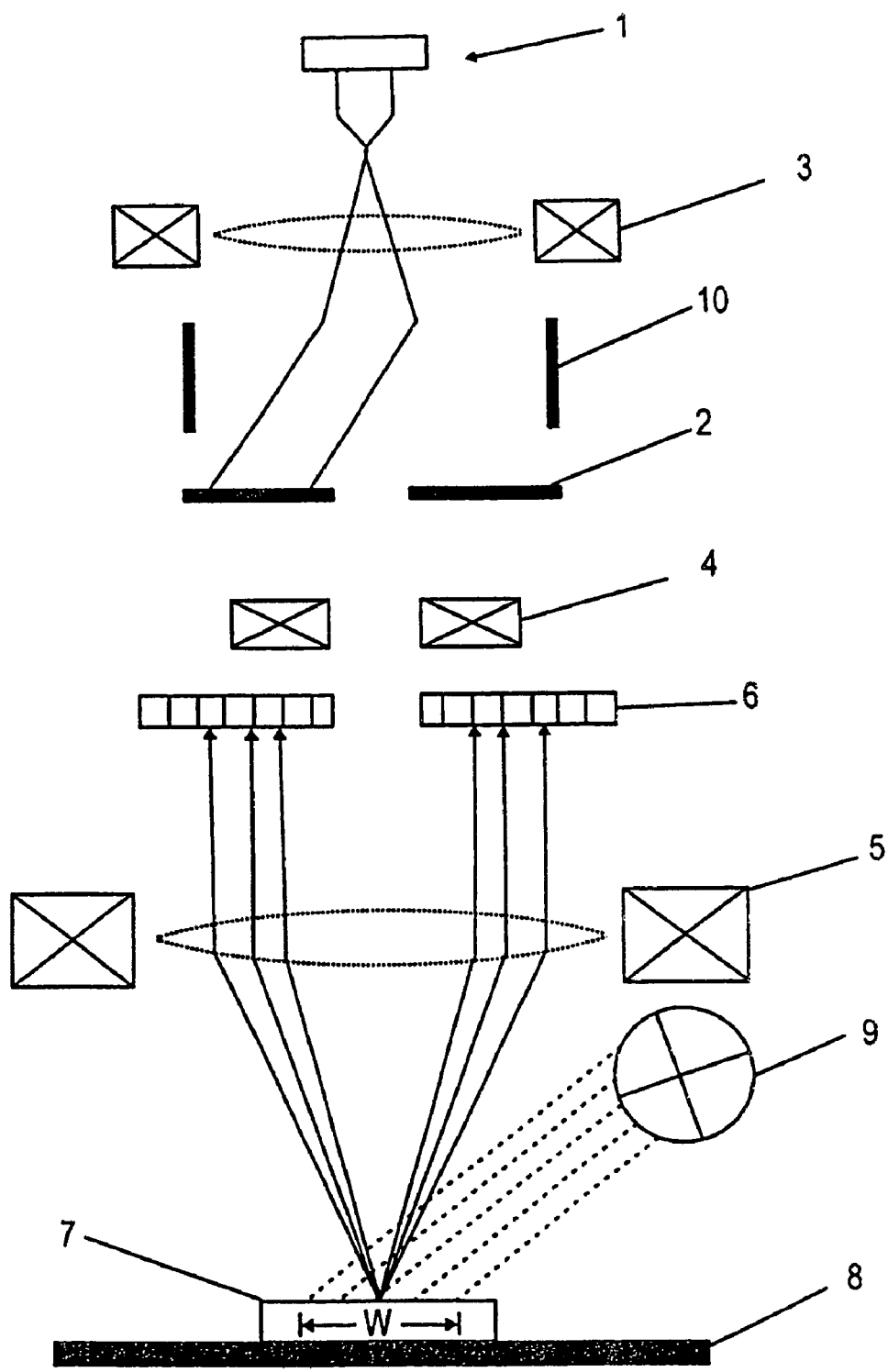
FIG. 9 shows the embodiment of FIG. 7 in a second mode of operation.

FIG. 9 shows one of the embodiments of the invention described in connection with FIG. 7 in a further mode of operation, referred to as PEEM mode hereinafter. In this pure PEEM mode light from a light source 9 is directed to the sample 7, but the blanking means 10 is used for blanking the primary beam. In this embodiment, the blanking means 10 are formed by a pair of electrodes. The electrical field applied between the electrodes deflects the primary beam away from the axis of the column and onto aperture 2B. Thus, the primary beam does not reach sample 7. Blanking means 10 blank the primary beam in case it is desired to have no electron beam incident on the sample. Otherwise, i.e. without blanking means 10, the source 1 of electrons would have to be turned off is this case. Especially, when switching to a pure PEEM mode or when switching between SEM/

SEEM and PEEM modes the blanking means 10 allow for fast switching since the electron source 1 is not altered in operation.

The above operational measures allow to operate an apparatus according to an embodiment of the present invention in a PEEM mode, i.e. the apparatus operated according to the above method serves as a Photo-Electron Emission Microscope. In this mode, the sectorized detector is operated such that the signals stemming from individual sectors are separately processed in parallel. Thus, this mode of operation allows for high throughput due to parallel, multi-pixel imaging, but spatial resolution is not as high as in the SEM mode: The spatial resolution is not defined by the narrow spot size of the primary beam as in the SEM mode, but by the sectorization of the detector as in the SEEM mode. As an example, the light of a mercury vapor lamp is used which has a wavelength between 200 nm and 600 nm and is relatively simple to produce. More advanced applications may use radiation from a synchrotron.

Also in the pure PEEM mode it may still be necessary to move the sample with respect to the beam to scan the sample. However, PEEM requires mechanical movement of the stage of the sample with respect to the primary beam, since it is not desirable to have additional deflecting means for the light beam, especially when taking into account that light at the typically used wavelengths of 200 nm to 300 nm is difficult to deflect by conventional optics. Furthermore, it is desirable in PEEM to provide a highly parallel beam which may be achieved by deflecting the beam as little as possible. Therefore, a movable stage provides a good means for mechanically moving the sample relative to the light beam.

In another embodiment of the present invention, an objective lens of a electron beam apparatus for focusing said condensed primary beam is adapted to switch between a focus forming an image of the particle source in a plane of a surface of a sample to be serially inspected and a focus forming an image of an aperture in a plane of a surface of a sample to be parallel inspected. It is especially preferred that the objective lens has a control means which allows for fast and easy switching between the two inspection modes.

The above electron beam apparatus may be operated in that a primary beam of electrons is generated by said particle source, collimating by said aperture, and focused by said objective lens. For operation in SEM mode, the objective lens is adjusted to form an image of the particle source in the focal plane, wherein the objective lens is adjusted to form an image of said aperture in the focal plane when the apparatus is operated in SEEM mode.

In summary, all the apparatuses according to an embodiment of the present invention allow a user to switch between different modes of sample inspection:

A user can inspect a sample in a single-pixel imaging mode by selecting an aperture of a small width for collimating a beam of electrons, scanning said sample using deflection means, and detecting secondary electrons by means of a detector, wherein signals produced by individual sectors of said detector are superimposed to generate a single or few output signals corresponding to a single pixel on the sample surface.

Further to the above, a user can also inspect a sample in a multi-pixel imaging mode by selecting an aperture means of a large width to produce a large diameter beam of electrons, directing the beam to an inspection region on the sample surface, and detecting secondary electrons in a sectorized detector, wherein each sector of said detector produces a signal indicative of a corresponding inspection area on said sample surface.

According to a further embodiment of the present invention, a user may also inspect a sample in a dual multi-pixel imaging mode by selecting an aperture means of a large width to produce a large diameter beam of electrons, producing a light beam, directing said large diameter beam of electrons and said light beam to a substantially coinciding inspection region on the sample surface, and detecting secondary particles by means of a sectorized detector, wherein each sector of said detector produces a signal indicative of a corresponding inspection area on said sample surface.

The invention claimed is:

1. A charged particle beam apparatus, comprising:
   a charged particle source for producing a primary beam of charged particles,
   a condenser lens for shaping said primary beam of charged particles;
   beam shaping means for collimating said primary beam of charged particles;
   wherein said beam shaping means is adapted to switch between a collimation of said primary beam resulting in a width appropriate for serial imaging and a collimation of said primary beam resulting in a width appropriate for parallel imaging;
   scanning means for deflecting said primary beam of charged particles; and
   a sectorized detector for detecting secondary charged particles.

2. The apparatus according to claim 1, wherein said primary beam width appropriate for serial imaging is between 1 nm and 100 nm.

3. The apparatus according to claim 1, wherein said primary beam width appropriate for parallel imaging is between 0.5 µm and 1000 µm.

4. The apparatus according to claim 1, wherein the beam shaping means comprises
   an objective lens for focusing said primary beam, wherein said objective lens is adapted to switch between forming an image of said charged particle source in a plane of a surface of a sample to be serially inspected and forming an image of an aperture means in a plane of a surface of a sample to be parallel inspected.

5. The apparatus according to claim 1, wherein said beam shaping means comprises said condenser lens and said condenser lens is adapted to switch the beam width of said primary beam between a width appropriate for serial imaging and a width appropriate for parallel imaging.

6. The apparatus according to claim 1, wherein said beam shaping means is an aperture having a diameter in the range of 10 µm to 50 µm in the case of serial imaging, and wherein the beam shaping means is an aperture having a diameter in the range of 100 µm to 200 µm in the case of parallel imaging.

7. The apparatus according to claim 1, wherein said sectorized detector is a multichannel plate with sectorized anode or an array of semiconductor detectors.

8. The apparatus according to claim 1, further comprising a movable stage for supporting and moving a sample.

9. The apparatus according to claim 1, further comprising a light source for producing a light beam.

10. The apparatus according to claim 9, wherein the wavelength of the light produced by said light source comprises the range of 200 µm to 300 µm.

11. The apparatus according to claim 9, wherein the light source further comprises means for forming a parallel light beam.

12. The apparatus according to claim 9, further comprising blanking means for blanking said primary beam of charged particles.

13. A method for operating the charged particle beam apparatus according to claim 9, wherein the method of operation of the charged particle beam apparatus is switched in operation between at least two of modes SEM, SEEM, PEEM or SEEM/PEEM.

14. A method for serially operating a charged particle beam apparatus having a charged particle source for producing a primary beam of charged particles, a condenser lens for shaping the primary beam of charged particles, a beam shaping means adapted to switch between a collimation of the primary beam to a width appropriate for serial imaging as well as a collimation of the primary beam to a width appropriate for parallel imaging, a scanning means for deflecting said primary beam of charged particles, and a sectorized detector for detecting secondary charged particles, the method comprising:

providing the charged particle beam apparatus;

adjusting the beam shaping means for collimating the primary beam of charged particles to collimate said primary beam of charged particles to the width appropriate for serial imaging of a sample, scanning said sample using the scanning means, wherein said primary beam of charged particles is directed to a respective position of a single pixel on said sample, and detecting secondary charged particles by means of the sectorized detector, wherein signals produced by individual sectors of said detector are merged to form a signal corresponding to said single pixel.

15. A method for operating a charged particle beam apparatus having a charged particle source for producing a primary beam of charged particles, a condenser lens for shaping the primary beam of charged particles, a beam shaping means adapted to switch between a collimation of the primary beam to a width appropriate for serial imaging as well as a collimation of the primary beam to a width appropriate for parallel imaging, a scanning means for deflecting said primary beam of charged particles, and a sectorized detector for detecting secondary charged particles, the method comprising:

providing the charged particle beam apparatus;

adjusting the beam shaping means for collimating the primary beam of charged particles to collimate said primary beam of charged particles to the width appropriate for parallel imaging of a sample;

directing said primary beam of charged particles to a predetermined position on said sample; and detecting secondary charged particles by means of the sectorized detector, wherein the signals produced by individual sectors of said detector are individually collected.

16. A method for operating a charged particle beam apparatus having a charged particle source for producing a primary beam of charged particles, a condenser lens for shaping the primary beam of charged particles, a beam shaping means adapted to switch between a collimation of the primary beam to a width appropriate for serial imaging as well as a collimation of the primary beam to a width appropriate for parallel imaging, a scanning means for deflecting said primary beam of charged particles, and a sectorized detector for detecting secondary charged particles, the method comprising:

providing the charged particle beam apparatus, adjusting the beam shaping means for collimating the primary beam of charged particles to collimate said primary beam of charged particles to the width appropriate for parallel imaging of a sample, producing a light beam, directing said primary beam of charged particles and said light beam to a predetermined position on said sample, and detecting secondary charged particles by means of the sectorized detector, wherein the signals produced by individual sectors of said detector are individually collected.

17. The method according to claim 16, wherein the charged particle beam and the light beam are adjusted to cancel a charge build-up on the sample surface.

18. The method according to claim 16, wherein the primary beam of charged particles is blanked by blanking means.

19. A method for operating a charged particle beam apparatus comprising a charged particle source for producing a primary beam of charged particles, a condenser lens for shaping the primary beam of charged particles, a beam shaping means adapted to switch between a collimation of the primary beam to a width appropriate for serial imaging as well as a collimation of the primary beam to a width appropriate for parallel imaging, a scanning means for deflecting said primary beam of charged particles, and a sectorized detector for detecting secondary charged particles, said method comprising:

generating a primary beam of charged particles by said particle source;

collimating said primary beam by an aperture; and focusing said collimated primary beam by said objective lens, wherein said objective lens is adjusted to form an image of said aperture in the working plane of said objective lens.

* * * * *